US 11,056,864 B2

(12) United States Patent
Sasaki et al.

(10) Patent No.: US 11,056,864 B2
(45) Date of Patent: Jul. 6, 2021

(54) ELECTRICAL JUNCTION BOX

(71) Applicant: Sumitomo Wiring Systems, Ltd., Yokkaichi (JP)

(72) Inventors: Yoshikazu Sasaki, Yokkaichi (JP); Yuichi Hattori, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/970,652

(22) PCT Filed: Feb. 7, 2019

(86) PCT No.: PCT/JP2019/004382
§ 371 (c)(1),
(2) Date: Aug. 18, 2020

(87) PCT Pub. No.: WO2019/163528
PCT Pub. Date: Aug. 29, 2019

(65) Prior Publication Data
US 2020/0381905 A1    Dec. 3, 2020

(30) Foreign Application Priority Data

Feb. 23, 2018    (JP) .............................. JP2018-030330

(51) Int. Cl.
| | |
|---|---|
| *H05K 5/02* | (2006.01) |
| *H05K 5/06* | (2006.01) |
| *B60R 16/023* | (2006.01) |
| *H02G 3/03* | (2006.01) |
| *H02G 3/08* | (2006.01) |
| *H05K 7/20* | (2006.01) |
| *B60R 16/03* | (2006.01) |

(52) U.S. Cl.
CPC ........... *H02G 3/03* (2013.01); *B60R 16/0239* (2013.01); *H02G 3/081* (2013.01); *H02G 3/088* (2013.01); *H05K 5/0213* (2013.01); *H05K 5/068* (2013.01); *H05K 7/20409* (2013.01); *B60R 16/03* (2013.01)

(58) Field of Classification Search
CPC ... H05K 5/068; H05K 5/0213; B60R 16/0239
See application file for complete search history.

(56) References Cited

U.S. PATENT DOCUMENTS 7,344,578 B2 * 3/2008 Origlia ................ B60R 16/0239
55/385.1
9,781,849 B2 * 10/2017 Negishi ................ H05K 5/0213
(Continued)

FOREIGN PATENT DOCUMENTS

| JP | H10-154882 A | 6/1998 |
|---|---|---|
| JP | 2010-288328 A | 12/2010 |

OTHER PUBLICATIONS

International Search Report, Application No. PCT/JP2019/004382, dated Apr. 2, 2019. ISA/Japan Patent Office.

*Primary Examiner* — Hung V Ngo
(74) *Attorney, Agent, or Firm* — Honigman LLP

(57) ABSTRACT

An electrical junction box includes an electronic component, a circuit assembly that has a conductive path and on which the electronic component is mounted, and a cover member for covering at least a portion of the circuit assembly, and the cover member is provided with an air valve that allows air permeation while inhibiting water from entering the circuit assembly side.

11 Claims, 8 Drawing Sheets

(56) References Cited

U.S. PATENT DOCUMENTS

| | | | |
|---|---|---|---|
| 10,501,031 B2* | 12/2019 | Kaneko | H05K 5/0069 |
| 2007/0134981 A1* | 6/2007 | Shinoda | H05K 5/068 |
| | | | 439/587 |
| 2008/0196918 A1* | 8/2008 | Zadach | H05K 5/0213 |
| | | | 174/50.5 |
| 2008/0310131 A1* | 12/2008 | Fino | H05K 7/20454 |
| | | | 361/758 |
| 2011/0211311 A1* | 9/2011 | Shinoda | H05K 5/0213 |
| | | | 361/694 |
| 2011/0228498 A1* | 9/2011 | Kawai | H05K 7/20409 |
| | | | 361/752 |
| 2017/0133903 A1 | 5/2017 | Ishizaki et al. | |
| 2019/0380214 A1* | 12/2019 | Sasaki | H05K 5/0056 |

* cited by examiner

FIG. 7
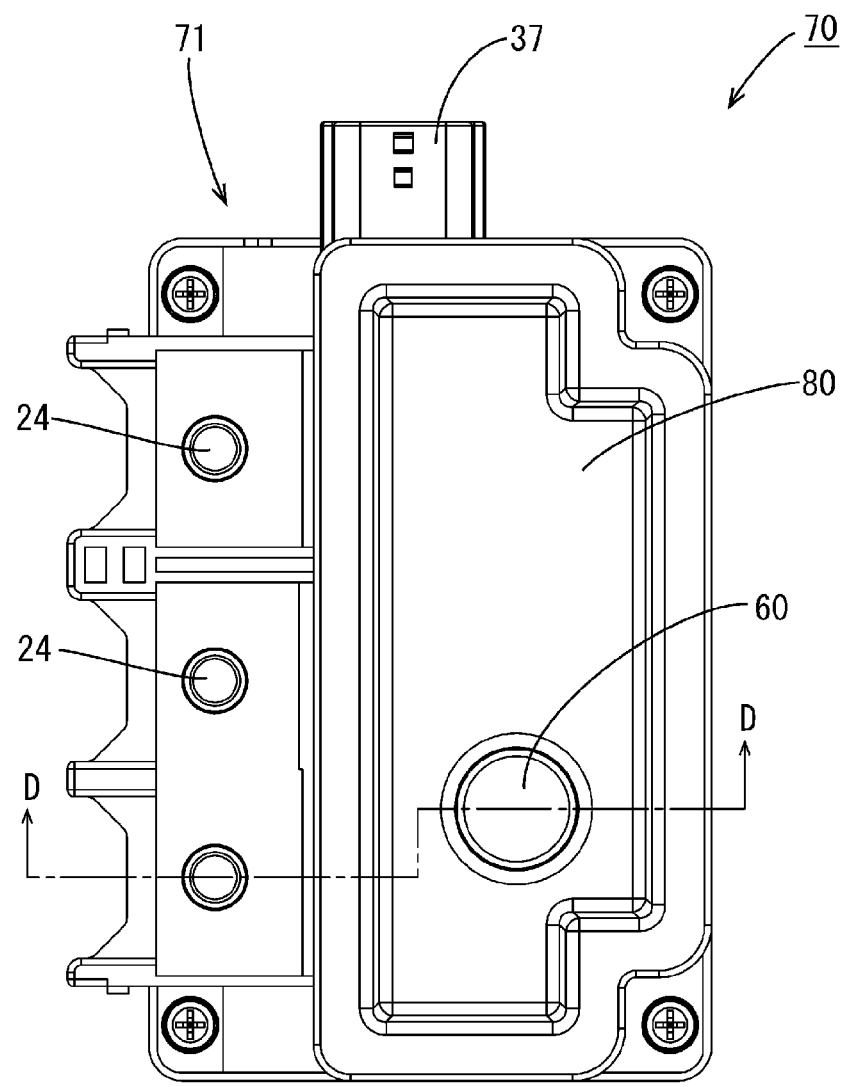
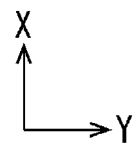

ELECTRICAL JUNCTION BOX

CROSS-REFERENCE TO RELATED APPLICATIONS

This application is the U.S. national stage of PCT/JP2019/004382 filed on Feb. 7, 2019, which claims priority of Japanese Patent Application No. JP 2018-030330 filed on Feb. 23, 2018, the contents of which are incorporated herein.

TECHNICAL FIELD

Technology relating to an electrical junction box will be disclosed in this specification.

BACKGROUND

Conventionally known is an electrical junction box for dissipating heat generated in electronic components mounted on a substrate. A control module disclosed in JP H10-154882A includes a metal case having an opening portion that is open in one direction, and a lid member covering the metal case. The lid member and a control circuit board can be fitted into the opening portion of the metal case with substantially no gap. Step portions for supporting the control circuit board are formed on two side portions of the inner surface of the case, and a device escape space for allowing circuit devices mounted on the control circuit board to escape is secured between step portions. A moisture entering path is disconnected by an O-ring serving as a seal member between the metal case and the lid member.

Incidentally, with the configuration disclosed in JP H10-154882A above, the circuit devices mounted on the control circuit board are arranged in the device escape space of the metal case, and thus there is a concern that air in the device escape space may expand due to heat generated in the circuit devices, resulting in some kind of failure.

Technology disclosed in this specification has been made based on the above-described circumstances, and aims to provide an electrical junction box that is capable of inhibiting failures caused by expansion of air in a space in which a circuit is arranged.

SUMMARY

An electrical junction box disclosed in this specification includes an electronic component, a circuit assembly that has a conductive path and on which the electronic component is mounted, and a cover member for covering at least a portion of the circuit assembly, in which the cover member is provided with an air valve that allows air permeation while inhibiting water from entering the circuit assembly side.

According to this configuration, air that has expanded in the space formed by covering the circuit assembly with the cover member is discharged through the air valve. Accordingly, it is possible to inhibit failures caused by expansion of air in the space in which the circuit assembly is arranged.

Embodiments of the technology disclosed in this specification preferably have the following features.

The cover member is a heat dissipation member on which the circuit assembly is placed and which is configured to dissipate heat generated in the circuit assembly, the heat dissipation member has a housing recess forming a space capable of housing the electronic component, and the air valve is provided in the housing recess and allows air permeation while inhibiting water from entering the housing recess.

In this manner, an electronic component is housed in a space formed by the housing recess of the heat dissipation member, and air that has expanded in the space in the housing recess is discharged through the air valve. Accordingly, it is possible to inhibit failures caused by expansion of air in the space of the heat dissipation member in which the electronic component is arranged.

The circuit assembly has a protruding portion that protrudes toward a side that is opposite to the heat dissipation member side.

Solder cannot be easily screen-printed using a squeegee or the like, in a configuration in which the circuit assembly has a protruding portion that protrudes on a side that is opposite to the heat dissipation member side. According to this configuration, an electrical junction box can be easily assembled because an electronic component can be mounted without screen printing on a surface located on the protruding portion side, due to the electronic component being mounted on the heat dissipation member side that is opposite to the protruding portion side.

The circuit assembly includes a resin portion made of resin, and a seal member is held between the resin portion and the heat dissipation member.

This can inhibit failures caused by expansion of air in the housing recess in a configuration in which air that has expanded in the housing recess is unlikely to be discharged due to a portion located between the resin portion and the heat dissipation member being sealed by the seal member.

An insulating coating film (an oxide film for aluminum, a cationic coating film for another metal, or the like) is formed on at least a surface of the heat dissipation member that faces the conductive path.

Accordingly, the insulating coating film can ensure insulating properties between the conductive path and the heat dissipation member.

The circuit assembly includes a frame portion provided with an opening portion, and the cover member is an opening cover for covering the opening portion.

An air-permeable membrane made of a porous resin that allows air permeation and does not allow water permeation is used as the air valve.

This simplifies the configuration of the air valve.

Advantageous Effects of Disclosure

According to the technology disclosed in this specification, it is possible to inhibit failures caused by expansion of air in the space in which a circuit is arranged.

BRIEF DESCRIPTION OF DRAWINGS

FIG. 7 is a plan view showing an electrical junction box of Embodiment 2.

DETAILED DESCRIPTION OF PREFERRED EMBODIMENTS

Embodiment 1 will be described with reference to FIGS. 1 to 6.

An electrical junction box 10 is disposed in a power supply path located between a power source such as a battery of a vehicle, e.g. an electric automobile or a hybrid automobile, and loads constituted by onboard electrical components such as lamps and a driving motor, for example. The electrical junction box 10 may be used in a DC-DC converter, an invertor, or the like. In the following description, "front" and "right" respectively refer to the X-direction and the Y-direction in FIG. 1, and "upper" refers to the Z-direction in FIG. 2.

Figure 2:
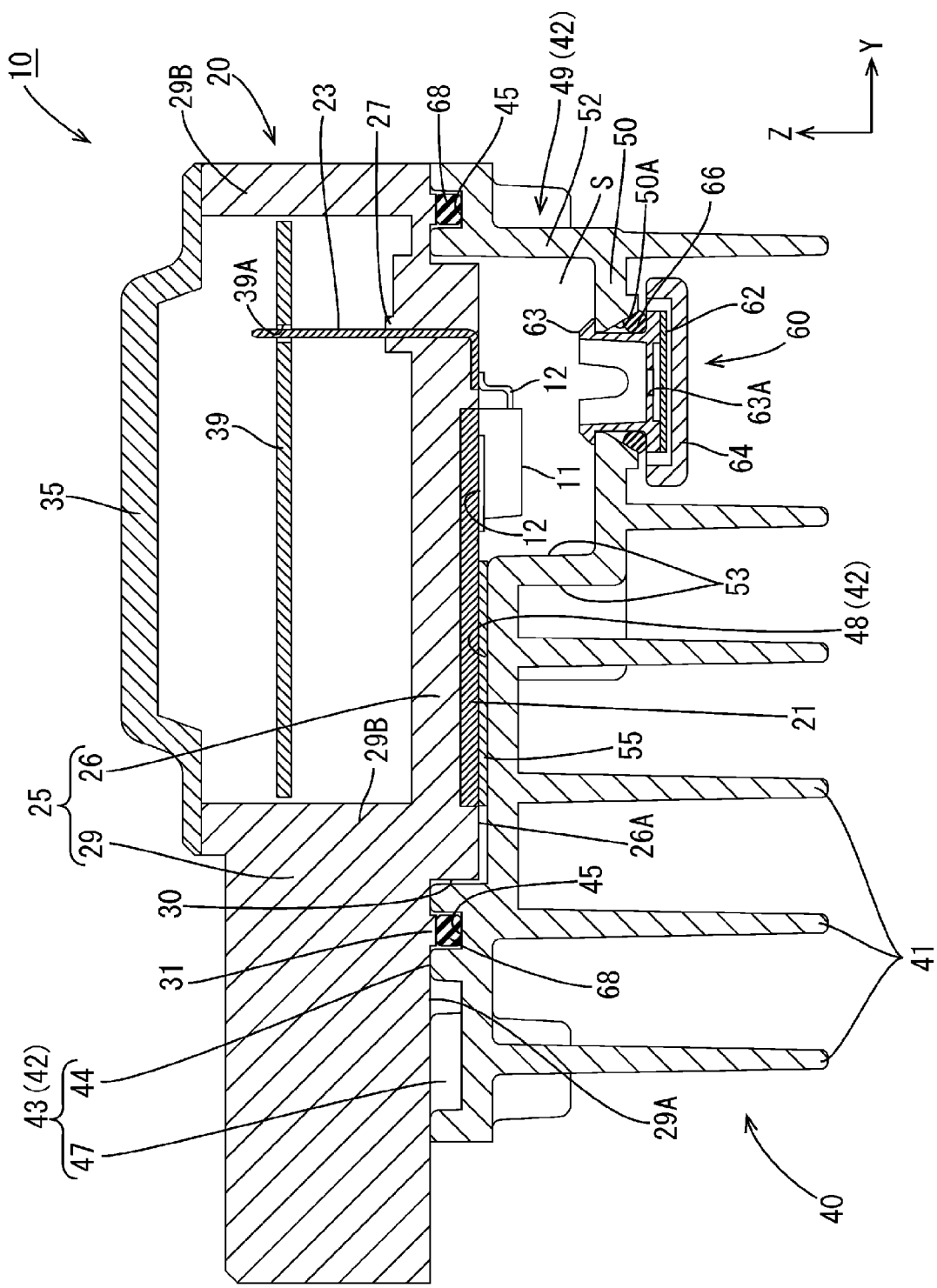
FIG. 2 is a cross-sectional view taken along A-A in FIG. 1.

As shown in FIG. 2, the electrical junction box 10 includes an electronic component 11, a circuit assembly 20 on which the electronic component 11 is mounted, a control circuit board 39 housed in the circuit assembly 20, and a heat dissipation member 40 that is placed on the lower side of the circuit assembly 20 and dissipates heat generated in the circuit assembly 20.

The electronic component 11 is a component that generates heat in response to the supply of power, and it is presumed that the electronic component 11 is a FET (Field Effect Transistor) in this embodiment. Note that the electronic component 11 is not limited to a FET, and may also be a resistor, a coil, or a capacitor, for example. The electronic component 11 has a plurality of lead portions 12 connected to a conductive path, and one lead portion 12 is provided on a bottom surface of the electronic component 11 (the upper side in FIG. 2), and the electronic component 11 also has a plurality of lead portions 12 protruding from a side surface of the electronic component 11.

The circuit assembly 20 includes a bus bar 21 serving as a conductive path, a relay terminal 23, and a resin portion 25 that is in intimate contact with the bus bar 21 and the relay terminal 23. The bus bar 21, which has a flat-plate shape and is made of metal such as copper or a copper alloy, has a shape corresponding to the shape of the power supply path. The bus bar 21 has high thermal conductivity and low electric resistance because the thickness of the bus bar 21 is larger than that of the relay terminal 23 (and a normal bus bar). Heat generated in the electronic component 11 can be diffused and equalized in the bus bar 21 by increasing the thickness of the bus bar 21 and using the opposite surface of the electronic component 11 from a conventional surface as a mounting surface. The relay terminal 23 is an L-shaped rod, and the bottom surfaces of the bus bar 21 and the relay terminal 23 are flush with a bottom surface 26A of the resin portion 25, and an upper side portion of the relay terminal 23 is connected to the control circuit board 39.

The resin portion 25 has a plate-shaped portion 26 that extends in a flat-plate shape along the bus bar 21, and a frame portion 29 that extends upward from the plate-shaped portion 26. The resin of the plate-shaped portion 26 is layered on the upper side of the bus bar 21 at a predetermined thickness, and no resin is layered on the lower side of the bus bar 21. A terminal holding portion 27 for holding a base end side of the relay terminal 23 protrudes upward from the plate-shaped portion 26 at a position on the upper surface of the plate-shaped portion 26 from which the relay terminal 23 protrudes.

The frame portion 29 forms a rising wall 29B that rises from a circumferential edge portion of the plate-shaped portion 26 in a direction orthogonal to the plate-shaped portion 26. The rising wall 29B houses the control circuit board 39 in the frame portion 29, enclosing the control circuit board 39. A bottom surface 29A of the frame portion 29 is formed at a position located a predetermined length higher than a bottom surface 26A of the plate-shaped portion 26, and a portion located between the bottom surface 29A of the frame portion 29 and the bottom surface 26A of the plate-shaped portion 26 can be regarded as a step portion 30. Also, a seal pushing protrusion 31 into which a seal member 68 can be pushed annularly extends at a position adjacent to a circumferential edge of the plate-shaped portion 26 on the bottom surface 29A of the frame portion 29.

The bus bar 21 that extends near the step portion 30 in the resin portion 25 is bent in a step shape and extends toward stud bolts 24 (see FIG. 1) located on the left side. A conductive path that extends leftward of the bus bar 21 as a single body with the bus bar 21 is in contact with the heads of the stud bolts 24, and shaft portions of the stud bolts 24 pass through the conductive path. The rising wall 29B and the relay terminal 23 of the circuit assembly 20 are protruding portions that protrude toward a side that is opposite to the heat dissipation member 40 side, and solder is not screen-printed on the upper side of the bus bar 21 because these protruding portions are present. A tubular opening portion that is open on the upper side of the rising wall 29B is closed by an opening cover 35. The opening cover 35 is made of a synthetic resin, for example, and is fixed to an upper end of the frame portion 29 through heat welding, and the frame portion 29 is sealed and waterproofed by the opening cover 35. The circuit assembly 20 is formed through molding in which a synthetic resin is injected in a state in which the bus bar 21 and the relay terminal 23 are disposed in a mold.

Figure 1:
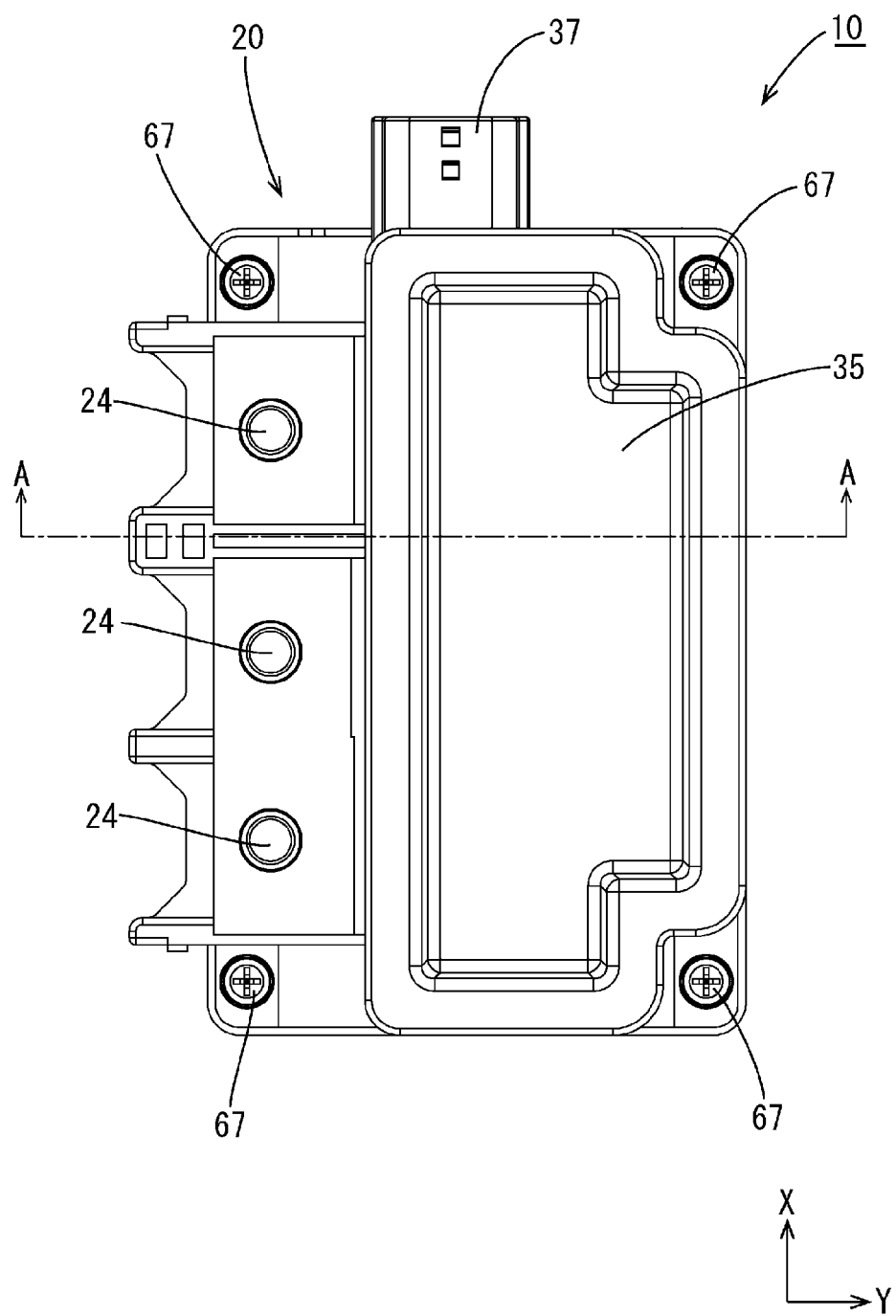
FIG. 1 is a plan view showing an electrical junction box of Embodiment 1.

As shown in FIG. 1, a front end of the circuit assembly 20 is provided with a connector housing 37 made of a synthetic resin. In the connector housing 37, a rectangular tubular hood portion is closed at a wall portion located on the back side, and a connector terminal passes through the back-side wall portion. The connector terminal is connected to the conductive path of the control circuit board 39. The control circuit board 39 is a printed circuit board on which a conductive path (not shown) made of a copper film or the like is formed through printed wiring on an insulating plate constituted by an insulating material. As shown in FIG. 2, the control circuit board 39 is disposed above and facing the plate-shaped portion 26 of the circuit assembly 20, and the control circuit board 39 is provided with a through-hole 39A into which a leading end of the relay terminal 23 is inserted and to which the leading end of the relay terminal 23 is soldered.

Figure 5:
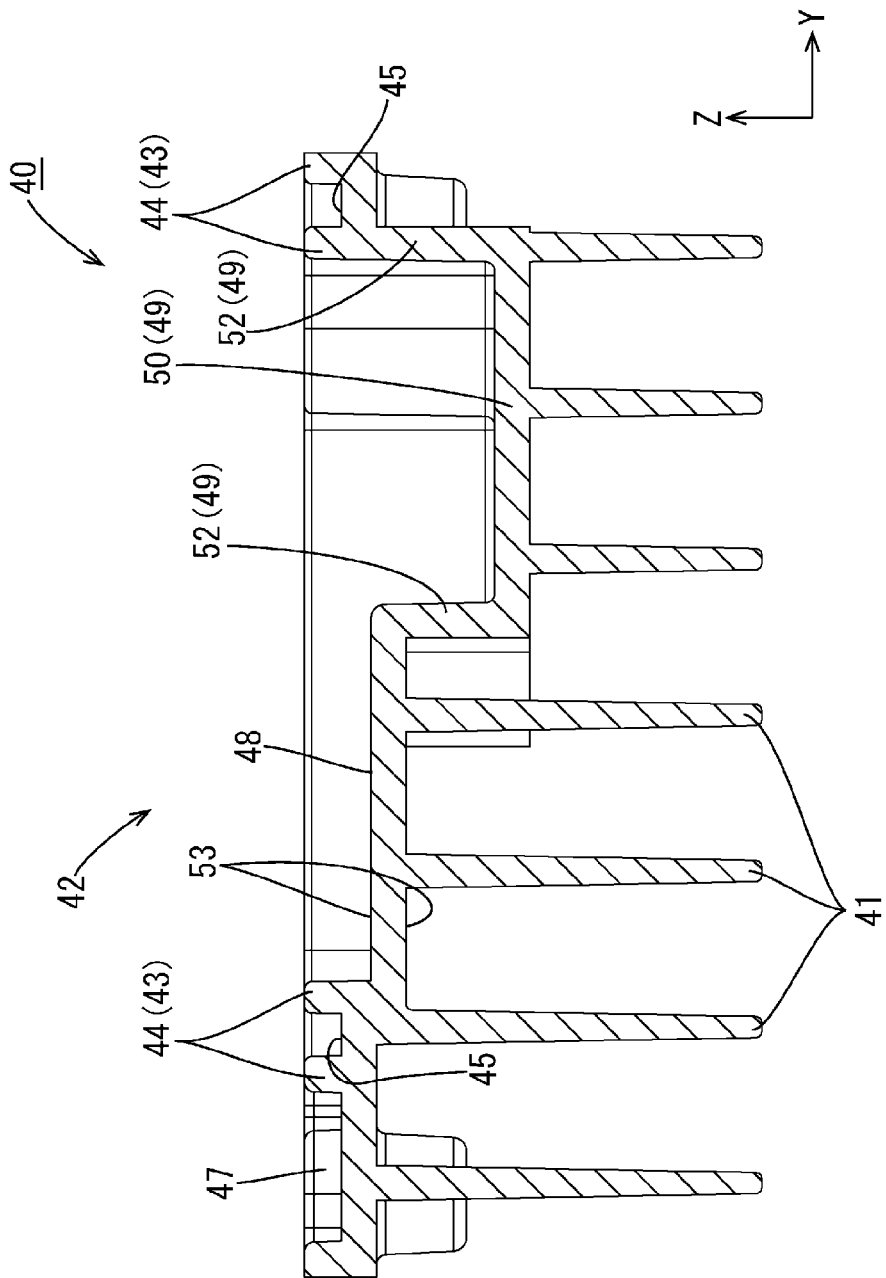
FIG. 5 is a cross-sectional view taken along B-B in FIG. 4.

The heat dissipation member 40 is made of a highly thermally conductive metal such as aluminum, an aluminum alloy, copper, or a copper alloy, and as shown in FIGS. 2 and 5, a plurality of heat dissipation fins 41 are arranged side-by-side on the lower side of the heat dissipation member 40. The upper surface of the heat dissipation member 40 can be regarded as an arrangement portion 42 on which the circuit assembly 20 is arranged. The arrangement portion 42 includes a support portion 43 that protrudes upward and supports the circuit assembly 20, a heat transfer opposing portion 48 that faces the circuit assembly 20 with a heat transfer material 55 interposed therebetween, and a housing recess 49 that is recessed downward.

Figure 3:
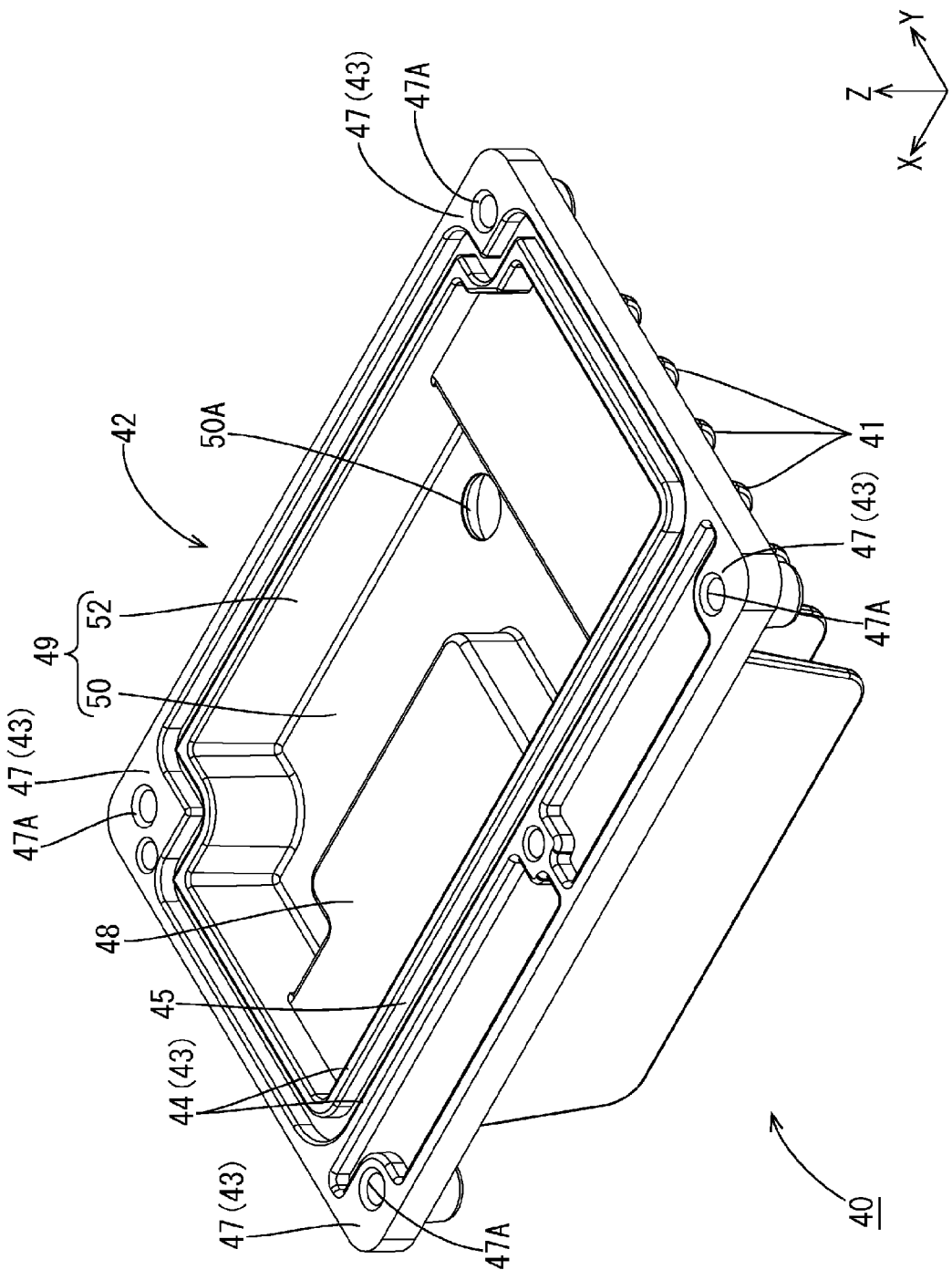
FIG. 3 is a perspective view showing a heat dissipation member.
Figure 4:
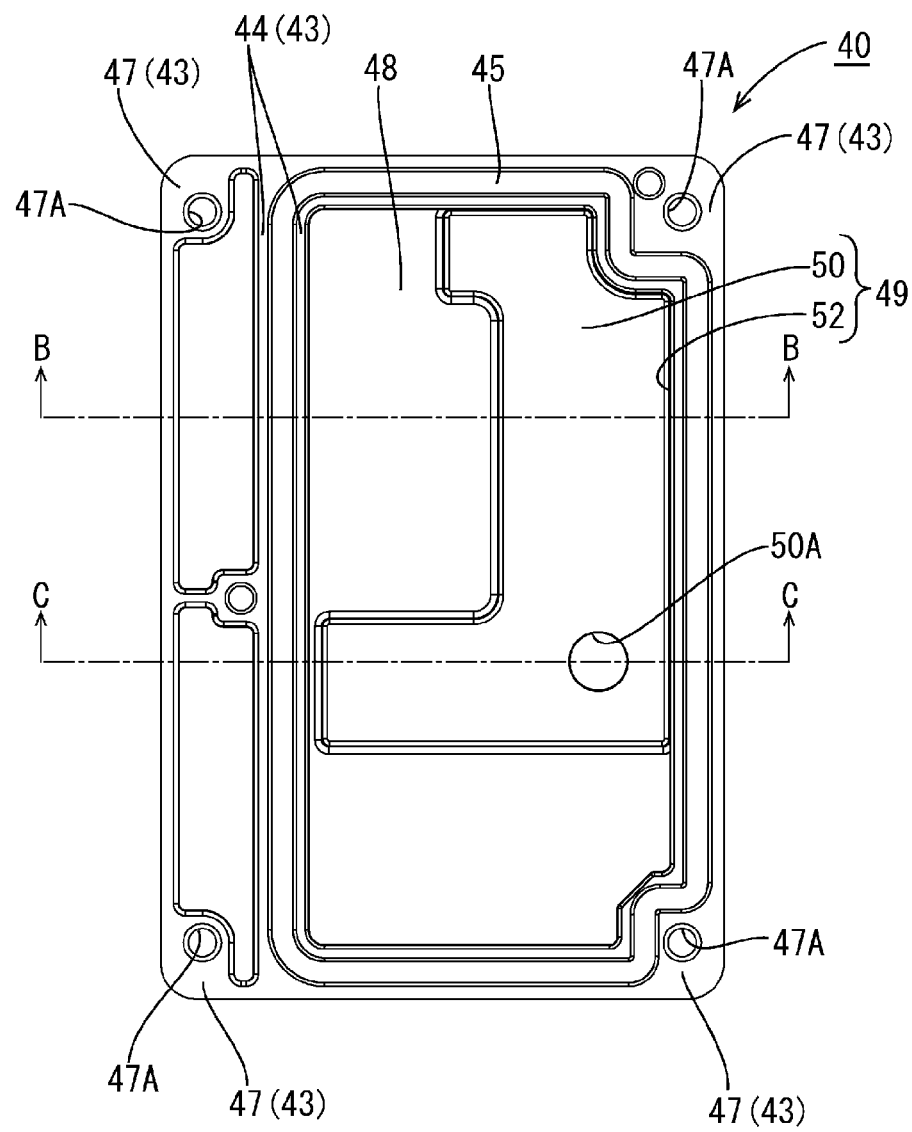
FIG. 4 is a plan view showing the heat dissipation member.

As shown in FIG. 3, the support portion 43 has a seal member housing portion 44 that extends annularly on the upper surface of the heat dissipation member 40, and fastening portions 47 into which screws 67 can be screwed. The seal member housing portion 44 is provided with an annular housing groove 45 capable of housing the seal member 68 from the upper side. The fastening portions 47 are formed outward of the support portion 43, and are provided with screw holes 47A. Four fastening portions 47 are formed at the four corners of the arrangement portion 42 (the upper surface of the heat dissipation member 40 in this embodiment.

Figure 6:
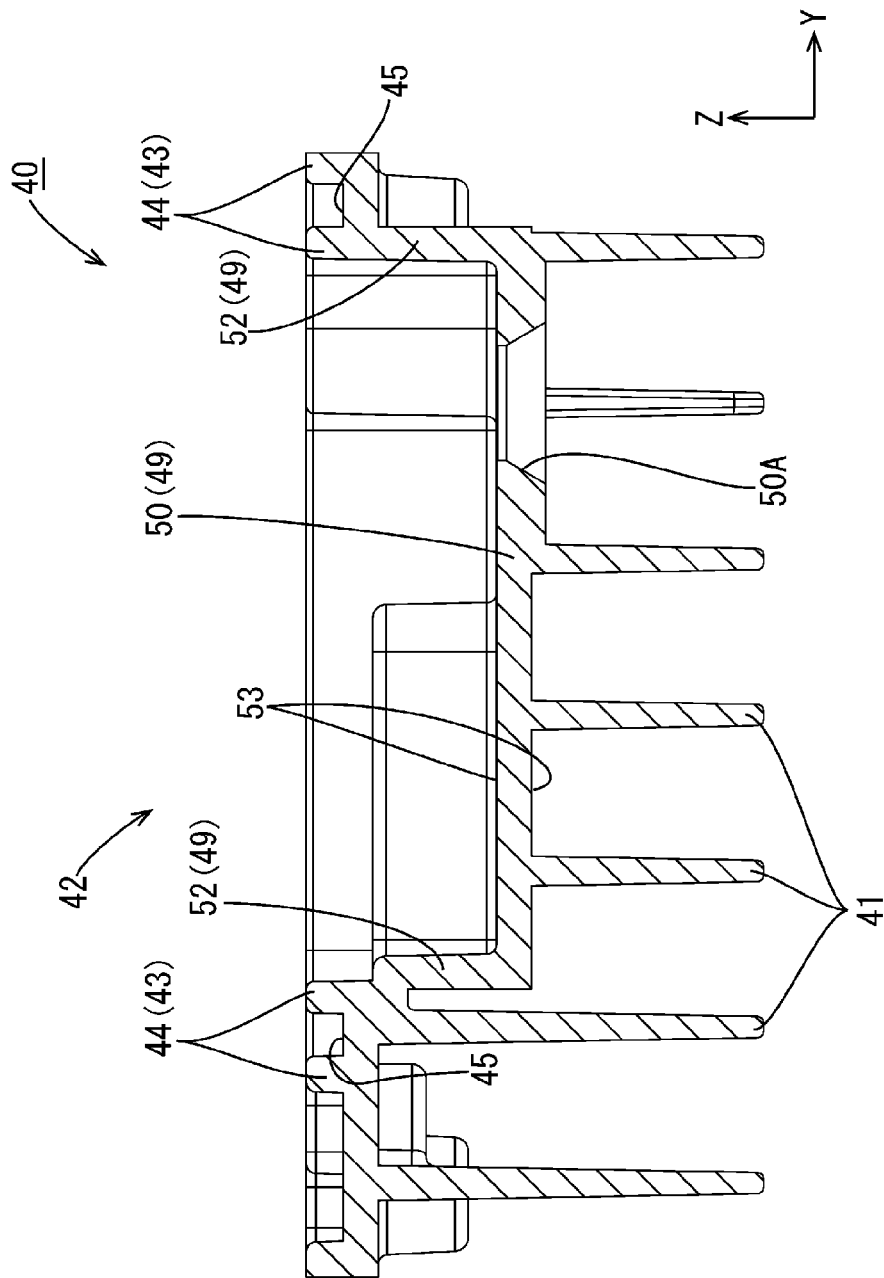
FIG. 6 is a cross-sectional view taken along C-C in FIG. 4.

As shown in FIG. 2, the heat transfer opposing portion 48 has a flat surface, and the flat surface is disposed facing the bus bar 21 at a position located a predetermined interval away from the bus bar 21 in a state in which the circuit assembly 20 is placed on the support portion 43 and the fastening portions 47. The heat transfer material 55 is arranged between the heat transfer opposing portion 48 and the bus bar 21. An insulating and highly thermally conductive synthetic resin or the like is used as the heat transfer material 55, and it is possible to use a heat dissipation adhesive made of an epoxy resin, for example. Note that the heat transfer material 55 is not limited thereto, and it is also possible to use a heat dissipation sheet in which a heat transfer material is applied to both sides of a sheet made of a synthetic resin, heat dissipation grease, or the like. Heat that is diffused in the bus bar 21 by increasing the thickness of the bus bar 21 is dissipated to the heat dissipation member 40 through the heat transfer material 55. This allows heat to be transferred at a desired level from the bus bar 21 to the heat dissipation member 40 even if the heat transfer material 55 has relatively high thermal resistance, and thus it is possible to select and simplify the heat transfer material 55. Also, because the heat capacity of the bus bar 21 is increased by increasing the thickness of the bus bar 21, the need to bring the entire surface of the bus bar 21 into contact with the heat dissipation member 40 is eliminated, and thus it is possible to provide the housing recess 49. As shown in FIGS. 5 and 6, the housing recess 49 includes a bottom portion 50, and a side wall portion 52 that extends upward in a direction orthogonal (a direction intersecting with) to the bottom portion 50, and the electronic component 11 mounted on the circuit assembly 20 is housed in a space S in the housing recess 49. The bottom portion 50 is formed in a region that is substantially L-shaped (a region on the XY-plane), and the side wall portion 52 annularly extends to surround the bottom portion 50.

As shown in FIGS. 2 and 6, the bottom portion 50 is provided with a circular through-hole 50A. The through-hole 50A has a tapered hole wall having a larger diameter on its lower side (the outer side), and an air valve 60 is mounted thereto.

An alumite layer 53 is formed on the entire outer surface of the heat dissipation member 40. The alumite layer 53 is formed through surface treatment in which an oxide film (aluminum oxides) is artificially generated by electrolyzing aluminum at the anode (positive electrode). Although a thin oxide film formed when aluminum is in contact with air corrodes through chemical reaction depending on the environment, the surface of aluminum can be protected by the alumite layer 53. Note that, although an alumite layer 53 is adopted in this embodiment, there is no limitation thereto, and the surface of aluminum may also be coated (e.g. by a cationic coating film if a metal other than aluminum is used).

The heat dissipation member 40 and the opening cover 35 covering the openings of the frame portion 29 can be regarded as cover members covering at least portions of the circuit assembly 20.

As shown in FIG. 2, the air valve 60 includes an air-permeable membrane 62, a locking portion 63 locked to a hole edge of the through-hole 50A located on the inner side of the housing recess 49, and a lid portion 64 covering the air-permeable membrane 62. The air-permeable membrane 62 is a film member that allows air permeation and prevents moisture permeation, and may be a waterproof and dust-proof polytetrafluoroethylene porous air-permeable membrane provided with minute pores in this embodiment, for example. The locking portion 63 is made of a synthetic resin, and has a pair of locking pieces capable of flexural deformation. Leading ends of locking pieces are provided with locking claws that protrude outward. A circular mechanical packing 66 is fitted around the locking portion 63, and a portion located between the locking portion 63 and a hole wall of the through-hole 50A is waterproofed by the mechanical packing 66. An air-permeable hole 63A is formed in the center portion of the lower end of the locking portion 63, and the air-permeable membrane 62 is fixed to the locking portion 63 through adhesion or the like to cover the air-permeable hole 63A. The lid portion 64 is a circular-plate shaped member made of a synthetic resin. Air and moisture pass through a gap between the lid portion 64 and the air-permeable membrane 62 (and the locking portion 63), and air passes through the air-permeable membrane 62 in response to expansion and contraction of air in the housing recess 49, whereas moisture cannot pass through the air-permeable membrane 62.

Assembly of the electrical junction box 10 will be described next.

The heat transfer material 55 is applied to the heat transfer opposing portion 48 of the heat dissipation member 40, the seal member 68 is housed in the seal member housing portion 44, and the air valve 60 to which the mechanical packing 66 is attached is mounted to the through-hole 50A of the heat dissipation member 40. Also, the circuit assembly 20 formed through molding is placed on the heat dissipation member 40, and the circuit assembly 20 is screwed to the fastening portions 47 of the heat dissipation member 40 by inserting the screws 67 into screw holes of the circuit assembly 20. Also, the opening cover 35 is placed on the rising wall 29B of the frame portion 29 to cover the frame portion 29, and the rising wall 29B and the opening cover 35 are heat welded to each other, and thus the electrical junction box 10 that is sealed in a waterproof manner is formed.

Effects of this embodiment will be described next.

The electrical junction box 10 includes the electronic component 11, the circuit assembly 20 that has a conductive path and on which the electronic component 11 is mounted, and the heat dissipation member 40 on which the circuit assembly 20 is placed, with the electronic component 11 mounted on the conductive path of the circuit assembly 20, and that dissipates heat generated in the circuit assembly 20. The heat dissipation member 40 has the housing recess 49 forming the space S that is capable of housing the electronic component 11 mounted on the conductive path of the circuit assembly 20, and the housing recess 49 is provided with the air valve 60 that allows air permeation while inhibiting water from entering the housing recess 49.

According to this embodiment, the electronic component 11 is housed in the space S formed by the housing recess 49 of the heat dissipation member 40, and air that has expanded in the space S in the housing recess 49 is discharged through air valve 60. Accordingly, it is possible to inhibit failures caused by expansion of air in the space S of the heat dissipation member 40 in which the electronic component 11 is arranged. Note that, when the temperature of the housing recess 49 decreases due to the supply of power being stopped, for example, air that has passed through the air valve 60 flows into the housing recess 49 due to contraction of air. Also, the housing recess 49 is unlikely to be heated due to the air valve 60.

Also, the circuit assembly 20 has the frame portion 29 and relay terminal 23 (the protruding portion) that protrude toward a side that is opposite to the heat dissipation member 40 side.

Solder cannot be easily screen-printed using a squeegee or the like, in a configuration in which the circuit assembly 20 has a protruding portion that protrudes on a side that is opposite to the heat dissipation member 40 side. According to this configuration, the electrical junction box 10 can be easily assembled because the electronic component 11 can be mounted without screen-printing on a surface located on the protruding portion side, due to the electronic component 11 being mounted on the heat dissipation member 40 side that is opposite to the protruding portion side.

Also, the circuit assembly 20 includes the resin portion 25 made of a synthetic resin, and the seal member 68 is held between the resin portion 25 and the heat dissipation member 40.

This can inhibit failures caused by expansion of air in the housing recess 49 in a configuration in which air that has expanded in the housing recess 49 is unlikely to be discharged to the outside due to a portion located between the resin portion 25 and the heat dissipation member 40 being sealed by the seal member 68.

Also, the alumite layer 53 is formed on at least the surface of the heat dissipation member 40 that faces the conductive path.

Accordingly, the alumite layer 53 (the insulating coating film) can ensure insulating properties between the bus bar 21 (the conductive path) and the heat dissipation member 40.

An air-permeable membrane 62 made of a porous resin that allows air permeation and does not allow water permeation is used as the air valve 60.

This simplifies the configuration of the air valve 60.

Embodiment 2

Next, Embodiment 2 will be described with reference to FIGS. 7 and 8. Although the air valve 60 of the electrical junction box 10 of Embodiment 1 is provided in the heat dissipation member 40, an air valve 60 of an electrical junction box 70 of Embodiment 2 is provided in an opening cover 80. Hereinafter, structures that are the same as those of Embodiment 1 are given the same reference numerals, and their description will be omitted.

The electrical junction box 70 is disposed in a power supply path located between a power source such as a battery of a vehicle, e.g. an electric automobile or a hybrid automobile, and loads constituted by onboard electrical components such as lamps and a driving motor, for example The electrical junction box 70 may be used in a DC-DC converter, an invertor, or the like.

Figure 8:
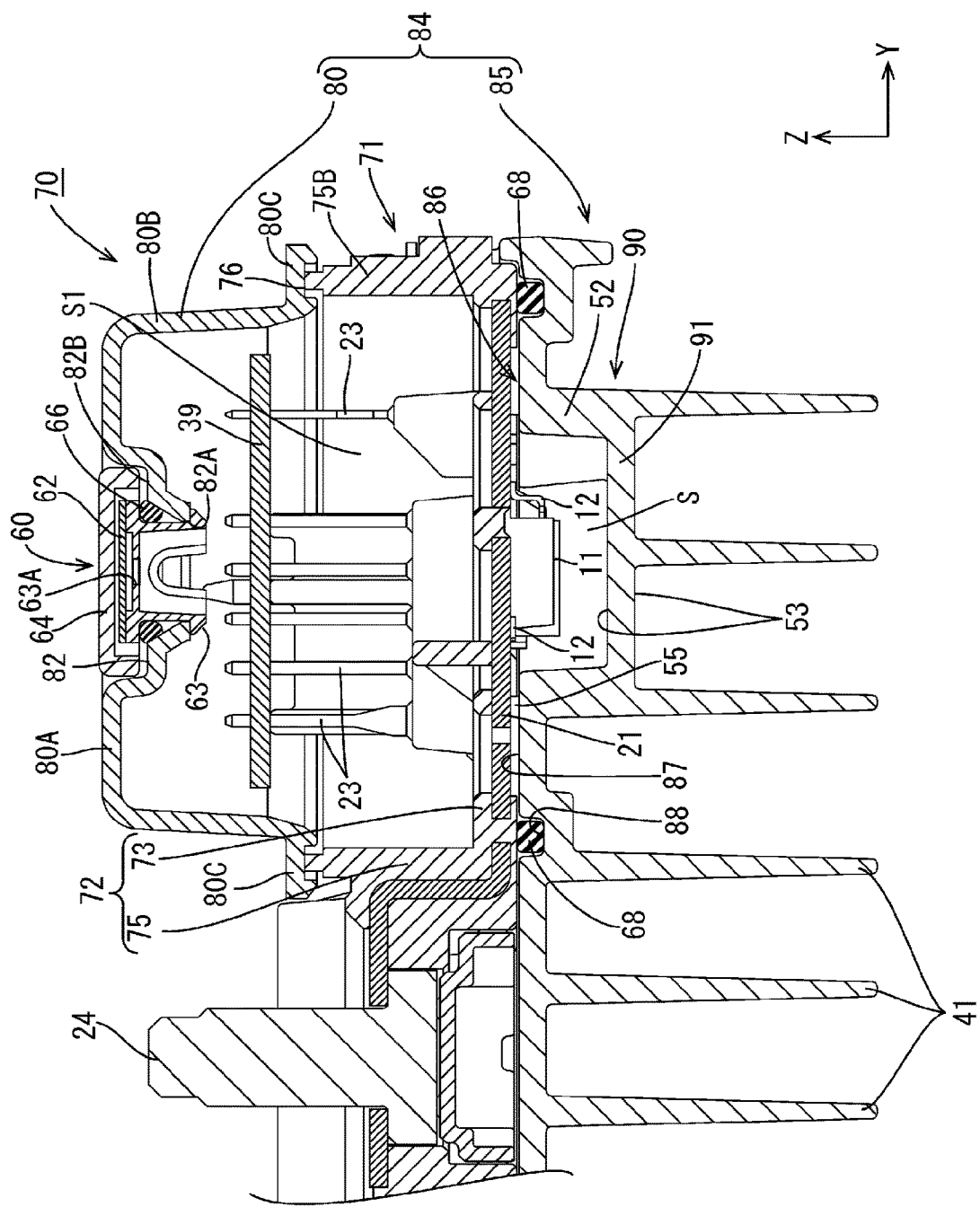
FIG. 8 is a cross-sectional view taken along D-D in FIG. 7.

As shown in FIG. 8, the electrical junction box 70 includes an electronic component 11, a circuit assembly 71 on which the electronic component 11 is mounted, a control circuit board 39 housed in the circuit assembly 71, and a cover member 84 for covering at least a portion of the circuit assembly 71. The circuit assembly 71 includes a bus bar 21 serving as a conductive path, a relay terminal 23, and a resin portion 72 that is in intimate contact with the bus bar 21 and the relay terminal 23.

The resin portion 72 has a plate-shaped portion 73 that extends in a flat-plate shape along the bus bar 21 and is fixed to the bus bar 21, and a frame portion 75 that extends upward from the plate-shaped portion 73. The frame portion 75 forms a rising wall 75B that rises from a circumferential edge portion of the plate-shaped portion 73 in a direction orthogonal to the plate-shaped portion 73. The control circuit board 39 is housed in the frame portion 75 as a result of the rising wall 75B enclosing the control circuit board 39.

The rising wall 75B and the relay terminal 23 of the circuit assembly 71 are protruding portions that protrude toward a side that is opposite to the heat dissipation member 85 side, and solder is not screen-printed on the upper side of the bus bar 21 due to these protruding portions. An upper end portion of the rising wall 75B is a tubular opening portion 76 that is open. The circuit assembly 71 is formed through molding in which a synthetic resin is injected in a state in which the bus bar 21 and the relay terminal 23 are disposed in a mold.

The cover member 84 includes an opening cover 80 for closing the opening portion 76, and a heat dissipation member 85 that is placed on a lower side of the circuit assembly 71 and dissipates heat generated in the circuit assembly 71. The opening cover 80 is made of a synthetic resin or metal, for example, and is fixed to the upper end of the rising wall 75B (the frame portion 75) in a sealed state through heat welding, which prevents water from entering through a gap located between the opening portion 76 and the opening cover 80 due to the opening cover 80 being heat welded thereto. The opening cover 80 includes a top plate 80A, a circumferential wall portion 80B extending downward from the top plate 80A, and a fixing portion 80C that extends outward from a lower end portion of the circumferential wall portion 80A in a flange shape, and that is fixed to the opening portion 76. The top plate 80A is provided with a circular pit 82 on its outer surface side to which the air valve 60 is attachable. The diameter of the pit 82 is reduced on the lower side (the circuit assembly 71 side) such that the pit 82 has a tapered shape, and the intermediate portion in the up-down direction is provided with a step portion 82B whose inner diameter changes stepwise. The lower end portion of the pit 82 is provided with a circular through-hole 82A. The air valve 60 is retained due to the locking portion 63 of the air valve 60 around which the mechanical packing 66 is fitted being locked to a hole edge of the through-hole 82A, and a portion located between the locking portion 63 and the outer surface of the pit 82 is waterproofed by the mechanical packing 66.

The heat dissipation member 85 is made of a highly thermally conductive metal such as aluminum, an aluminum alloy, copper, or a copper alloy, and a plurality of heat dissipation fins 41 are arranged side-by-side on the lower side of the heat dissipation member 85. The upper surface of the heat dissipation member 85 can be regarded as an arrangement portion 86 on which the circuit assembly 71 is arranged. The arrangement portion 86 includes a heat transfer opposing portion 87 that faces the circuit assembly 71 with the heat transfer material 55 interposed therebetween, and a housing recess 90 that is recessed downward.

The arrangement portion 86 is provided with a housing groove 88 that annularly extends on the upper surface of the heat dissipation member 85. The heat transfer material 55 is arranged between the heat transfer opposing portion 87 and the bus bar 21. The housing recess 90 includes a bottom portion 91, and a side wall portion 52 that extends upward in a direction orthogonal (a direction intersecting with) to the bottom portion 91, and the electronic component 11 mounted on the circuit assembly 71 is housed in the space S in the housing recess 90. Note that unlike the housing recess 49 of Embodiment 1, the housing recess 90 is not provided with the through-hole 50A.

Assembly of the electrical junction box 70 will be described next.

The heat transfer material 55 is applied to the heat transfer opposing portion 87 of the heat dissipation member 85, and the seal member 68 is housed in the housing groove 88. Also, the circuit assembly 71 formed through molding is placed on the heat dissipation member 85, and the circuit assembly 71 is screwed to fastening portions of the heat dissipation member 85 by inserting screws (not shown) into screw holes of the circuit assembly 71. Also, the opening cover 80 is placed on the rising wall 75B to cover the opening portion 76 of the frame portion 75, and the rising wall 75B and the opening cover 80 are heat welded to each other, and thus the opening cover 80 is fixed onto the rising wall 75B. Also, when the air valve 60 to which the mechanical packing 66 is attached is attached to the pit 82 of the opening cover 80 from the outer surface side, and the locking portion 63 of the air valve 60 is locked to the hole edge of the through-hole 82A, the sealed electrical junction box 70 in which the opening cover 80 is sealed in a waterproof manner is formed.

According to Embodiment 2, the following effects are obtained.

The electrical junction box 70 includes the electronic component 11, the circuit assembly 71 that has a conductive path and on which the electronic component 11 is mounted, and the cover member 84 for covering at least a portion of the circuit assembly 71, and the cover member 84 is provided with the air valve 60 that allows air permeation while inhibiting water from entering the circuit assembly 71 side.

According to this embodiment, the electronic component 11 is housed in a space 51 covered by the opening cover 80 (a cover member), and air that has expanded in the space 51 is discharged through the air valve 60. Accordingly, it is possible to inhibit failures caused by expansion of air in the space 51 in which the circuit assembly 71 is arranged.

Other Embodiments

The technology disclosed in this specification is not limited to the embodiments described above with use of the foregoing description and drawings, and embodiments such as the following are also encompassed in the technical scope of the technology disclosed in this specification.

Although a configuration is adopted in which the air valve 60 includes the air-permeable membrane 62, there is no limitation thereto, and other known air valves may also be used.

Although the circuit assemblies 20 and 71 have a configuration in which the bus bar 21 is made of resin through molding, there is no limitation thereto. A configuration may also be adopted in which a substrate in which a bus bar is adhered to a printed circuit board is used as a circuit assembly.

A configuration may also be adopted in which air is allowed to flow by forming through-holes in the resin portions 25 and 72 such that the space S in the housing recesses 49 and 90 and the space S located on the control circuit board 39 side (the inside of the rising wall 29B) are in communication with each other.

Although a configuration is adopted in which the air valve 60 is provided in one of the housing recesses 49 and 90 of the heat dissipation members 40 and 85 and the opening covers 35 and 80, there is no limitation thereto, and a configuration may also be adopted in which the air valves 60 are provided in the housing recesses 49 and 90 and the opening covers 35 and 80.

The invention claimed is:

1. An electrical junction box comprising:
   an electronic component;
   a circuit assembly that has a conductive path and on which the electronic component is mounted; and
   a heat dissipation member on which the circuit assembly is placed and which is configured to dissipate heat generated in the circuit assembly,
   wherein the heat dissipation member has a housing recess forming a space capable of housing the electronic component,
   the circuit assembly includes a frame portion provided with an opening portion,
   the electrical junction box comprises an opening cover for closing the opening portion in a sealed state, and
   a first air valve that allows air permeation while inhibiting water from entering the circuit assembly, wherein the first air valve is disposed on the heat dissipation member.

2. The electrical junction box according to claim 1, wherein a second air valve is provided in the housing recess and allows air permeation while inhibiting water from entering the housing recess.

3. The electrical junction box according to claim 2, wherein the circuit assembly has a protruding portion that protrudes toward a side that is opposite to the heat dissipation member side.

4. The electrical junction box according to claim 2, wherein an insulating coating film is formed on at least a surface of the heat dissipation member that faces the conductive path.

5. The electrical junction box according to claim 2, wherein an air-permeable membrane made of a porous resin that allows air permeation and does not allow water permeation is used as the second air valve.

6. The electrical junction box according to claim 1, wherein the circuit assembly has a protruding portion that protrudes toward a side that is opposite to the heat dissipation member side.

7. The electrical junction box according to claim 6, wherein an insulating coating film is formed on at least a surface of the heat dissipation member that faces the conductive path.

8. The electrical junction box according to claim 6, wherein an air-permeable membrane made of a porous resin that allows air permeation and does not allow water permeation is used as the first air valve.

9. The electrical junction box according to claim 1, wherein an insulating coating film is formed on at least a surface of the heat dissipation member that faces the conductive path.

10. The electrical junction box according to claim 9, wherein an air-permeable membrane made of a porous resin that allows air permeation and does not allow water permeation is used as the first air valve.

11. The electrical junction box according to claim 1, wherein an air-permeable membrane made of a porous resin that allows air permeation and does not allow water permeation is used as the first air valve.

* * * * *